United States Patent [19]

Schwalm

[11] Patent Number: 5,453,341

[45] Date of Patent: Sep. 26, 1995

[54] RADIATION-SENSITIVE POLYMERS AND POSITIVE-WORKING RECORDING MATERIALS

[76] Inventor: Reinhold Schwalm, 53 Am Huettenwingert, 6706 Wachenhaim, Germany

[21] Appl. No.: 273,620

[22] Filed: Jul. 12, 1994

Related U.S. Application Data

[60] Continuation of Ser. No. 27,902, Mar. 8, 1993, abandoned, which is a division of Ser. No. 844,977, Mar. 2, 1992, Pat. No. 5,260,410, which is a continuation of Ser. No. 507,890, Apr. 12, 1990, abandoned.

[30] Foreign Application Priority Data

Apr. 29, 1989 [DE] Germany .................. 39 14 407.0

[51] Int. Cl.$^6$ ............................. G03F 7/035; B32B 3/10
[52] U.S. Cl. ..................... 430/18; 430/270; 430/326; 428/195
[58] Field of Search ................ 430/18, 270, 326

[56] References Cited

U.S. PATENT DOCUMENTS

| | | | |
|---|---|---|---|
| 4,663,269 | 5/1987 | Narang et al. | 430/270 |
| 4,708,925 | 11/1987 | Newman | 430/270 |
| 4,816,383 | 3/1989 | Taguchi et al. | 430/270 |
| 4,883,740 | 11/1989 | Schwalm et al. | 430/270 |
| 5,075,199 | 12/1991 | Schwalm et al. | 430/326 |
| 5,130,392 | 7/1992 | Schwalm et al. | 430/270 |
| 5,334,699 | 8/1994 | Hsieh | 430/115 |

*Primary Examiner*—Christopher D. Rodee
*Attorney, Agent, or Firm*—Keil & Weinkauf

[57] ABSTRACT

Radiation-sensitive polymers contain, in the polymer main chain, both acid-labile groups and onium salt groups with nonnucleophilic counterions and are suitable for the production of semiconductor structural elements.

1 Claim, No Drawings

RADIATION-SENSITIVE POLYMERS AND POSITIVE-WORKING RECORDING MATERIALS

This application is a FWC of application Ser. No. 08/027,902, filed on Mar. 8, 1993, now abandoned, which is a Division of Ser. No. 07/844,977 filed on Mar. 2, 1992, now U.S. Pat. No. 5,260,410, which is a FWC of Ser. No. 07/507,890 filed on Apr. 12, 1990, now abandoned.

The present invention relates to radiation-sensitive polymers which contain acid-labile groups and onium salts in the polymer main chain which are decomposed by the action of light and subsequent thermal treatment to give low molecular weight products which can be removed under reduced pressure or by treatment with alkaline or polar solvents, so that said polymers are suitable for photoresists.

Radiation-sensitive, positive-working polymers are known. Thus, in particular poly-(alkyl methacrylates) are used as photoresists since they suffer a decrease in molecular weight under the action of light and thus have a higher solubility than the high molecular weight, unexposed areas.

Another class comprises poly-(olefin sulfones), which likewise undergo decomposition on irradiation and release sulfur dioxide.

A number of polymer-bonded sulfonium salts, for example

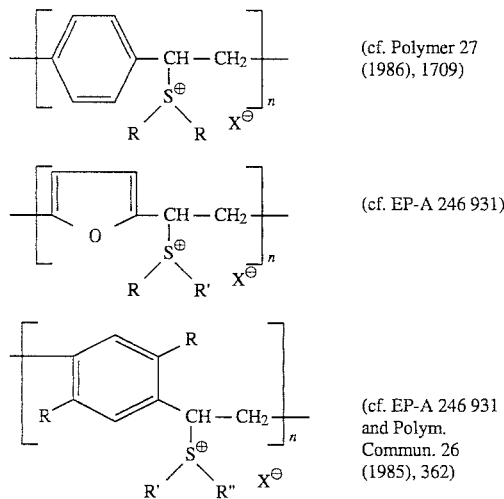

where R, R' and R" are each alkyl, X is halogen and n is >5, have already been described.

Radiation-sensitive polymers which contain sulfonium salt units in the polymer side chain are also known (cf. H. Tagoshi and T. Endo, J. Polym. Sci., Part C: Polym. Lett., 26 (1988), 77–81); however, these polymers do not contain any acid-labile groups but contain spiro-ortho-esters, which crosslink under the action of light.

Photosensitive polymers which contain aryl-onium salts, such as iodonium or sulfonium salts, in the polymer main chain are also known (cf. J. V. Crivello and J. H. W. Lam, J. Polym. Sci., Chem. Ed., 17 (1979), 3845–3858 and J. V. Crivello, J. L. Lee and D. A. Conlon, Makromol. Chem., Macromol. Symp. 13/14 (1988), 145–160). These onium salts are incorporated in polyimide chains and undergo cleavage at the onium unit on exposure, so that a reduction of the molecular weight is achieved. Since the quantum yield of the onium salts is <1, the achievable sensitivity is relatively low.

It is an object of the present invention to provide photoresist materials which ensure a homogeneous distribution of the photoactive groups in the resist layer, have high sensitivity and, if required, are capable of being developed by the dry method, ie. without the use of solvents.

We have now found that this object is achieved, surprisingly, by the novel radiation-sensitive polymers which contain, in the polymer main chain, both acid-labile, in particular carbonate, groups and onium salt groups, in particular sulfonium salt groups, with nonnucleophilic counterions.

The present invention relates to radiation-sensitive polymers which contain, in the polymer main chain, both acid-labile groups and onium salt groups, in particular sulfonium salt groups, with nonnucleophilic counterions.

The novel radiation-sensitive polymers preferably contain units of the general formulae (I) and (III) or (II) and (III)

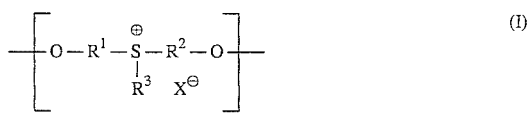

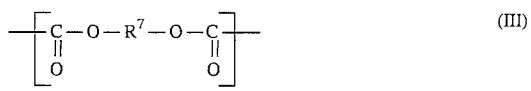

where
$R^1$ and $R^2$ are identical or different and are each alkylene, for example of 1 to 9 carbon atoms, such as —$CH_2$—$CH_2$— or —$CH_2$—$CH_2$—$CH_2$—, phenylene, naphthylene or substituted phenylene, eg.

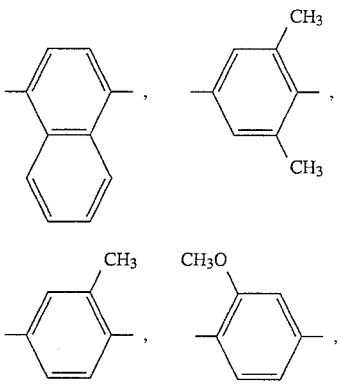

$R^3$ is alkyl, for example of 1 to 9 carbon atoms, eg. methyl or ethyl, cyclohexyl, phenyl, naphthyl or substituted phenyl, eg. 4-tert-butylphenyl, 4-methylphenyl or 4-methoxyphenyl, $R^4$ is a trivalent aliphatic or aromatic hydrocarbon radical, eg.

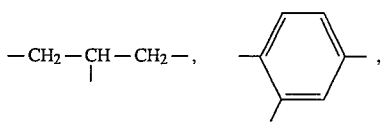

$R^5$ and $R^6$ are identical or different and are each alkyl or phenyl or $R^5$ and $R^6$ together form a 5-membered or 6-membered ring, eg. methyl, phenyl, 4-methylphenyl or —CH$_2$—CH$_2$—CH$_2$—CH$_2$—, $R^7$ is alkylene, for example of 2 to 10 carbon atoms, phenylene or 1,4-phenylenedialkylene, eg.

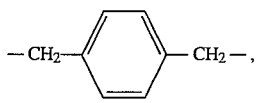

divalent radicals having branches, eg.

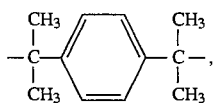

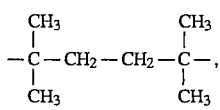
and
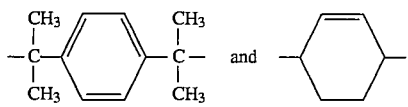

being preferred, or divalent silicon-containing radicals, eg.

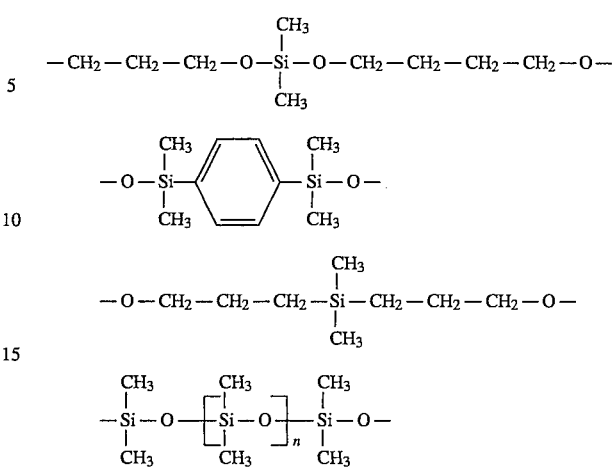

and

X is halogen, eg. I, Br, ClO$_4$, F—SO$_3$, CF$_3$—SO$_3$, BF$_4$, PF$_6$, AsF$_6$ or SbF$_6$.

The novel radiation-sensitive polymers contain in general from 2 to 50, preferably from 5 to 25, mol % of condensed monomer units having sulfonium salt groups.

They preferably consist of condensed units, at least one of the units stated under (I) with at least one of the units stated under (III) or at least one of the units stated under (II) with at least one of the units stated under (III)

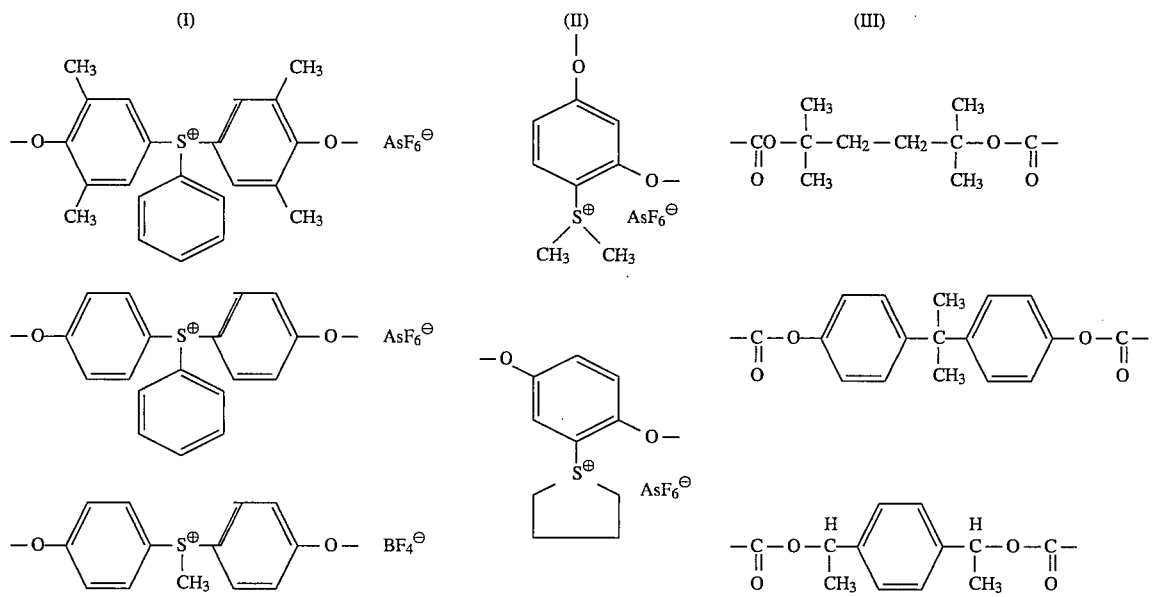

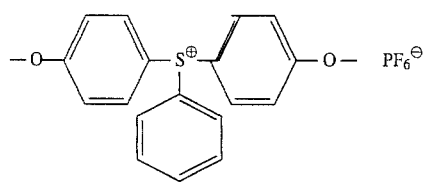

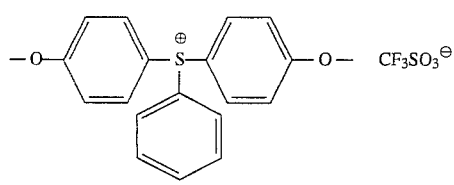

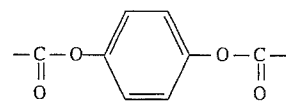

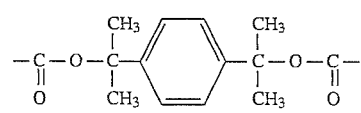

The present invention also relates to a positive-working recording material in which the exposed parts are removed using an alkaline developer or a polar solvent or under reduced pressure, radiation-sensitive polymers according to one of the preceding claims being used.

The present invention furthermore relates to a process for the production of semiconductor structural elements, wherein a novel radiation-sensitive polymer is applied to a substrate which contains a semiconductor material, the radiation-sensitive layer is exposed to electromagnetic radiation in a desired pattern and if necessary heated to 60°–120° C., the pattern is developed and the production of the semiconductor structural element is completed in a conventional manner.

Regarding the components of the novel polymer, the following may be stated:

1. Sulfonium salts

If the novel polymers are synthesized by polycondensation reactions, the sulfonium salt units of the general formula (I) can be incorporated in the polycondensate via the hydroxyl groups. Examples of such sulfonium salts are:

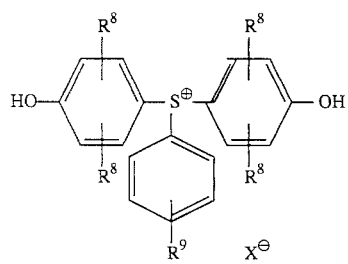

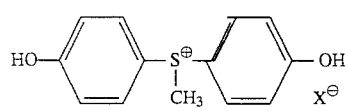

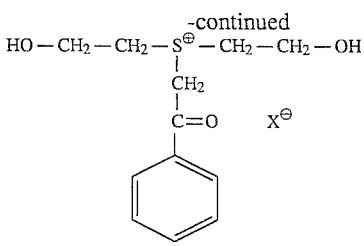

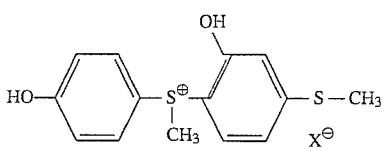

$R^8$=H, alkyl, halogen or alkoxy ($C_1$–$C_6$)
$R^9$=H, alkyl, halogen, or alkoxy ($C_1$–$C_6$).

Although these sulfonium salts are preferred, it is also possible to use monomer building blocks in which the condensable groups are localized at a phenyl radical. Examples of such suitable sulfonium salts are:

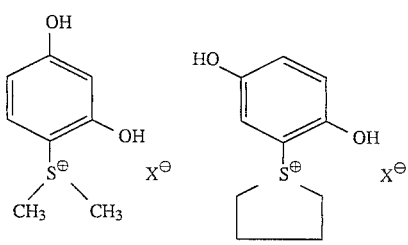

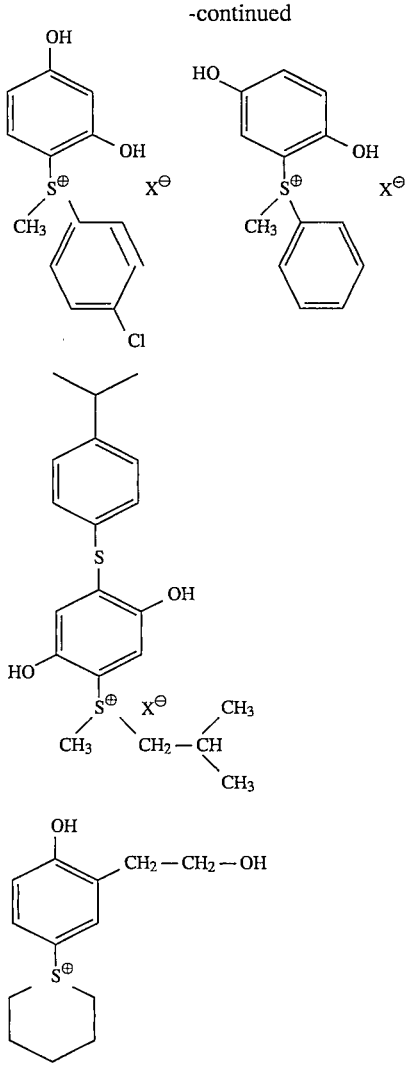

$X^- = Br^-, Cl^-, ClO_4^-, FSO_3^-, CF_3SO_3^-, BF_4^-, PF_6^-, AsF_6^-, SbF_6^-$.

2. Cocondensation components

For the purposes of the present invention, the groups incorporated in the copolymer are those which are readily clearable by an acid. Examples of such groups are ethers, acetals, ortho-esters, carbonates and others.

Preferably produced acid-labile groups are carbonate groups, so that aliphatic or aromatic diols are suitable cocondensation components. Examples of such diols are:

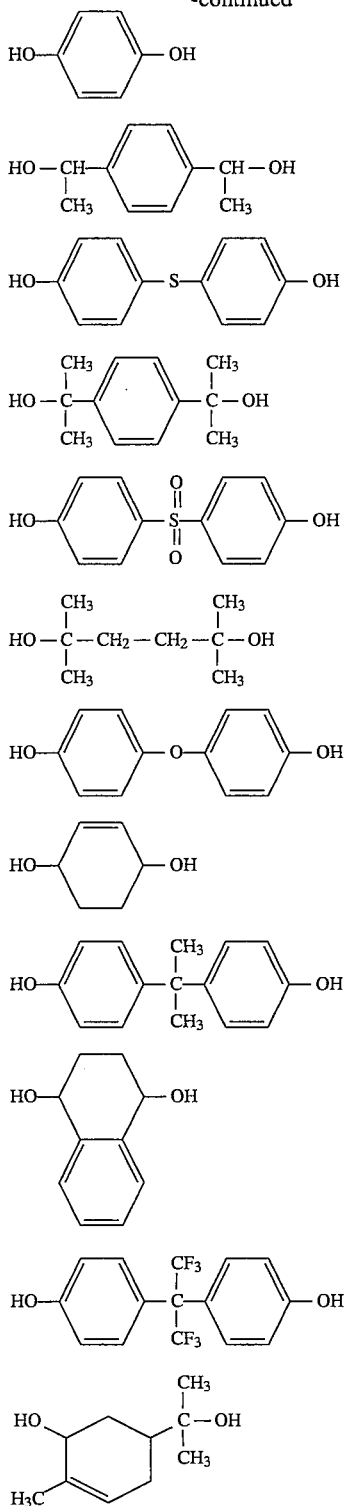

The polycondensation reactions can be carried out by known methods, by effecting condensation with the aid of carbonic acid derivatives, such as phosgene, carbonyl-bisimidazole or other suitable derivatives. In specific cases, it proves advantageous to react the diol components with carbonic acid derivatives before the actual condensation reaction to give active ester compounds of the following structure:

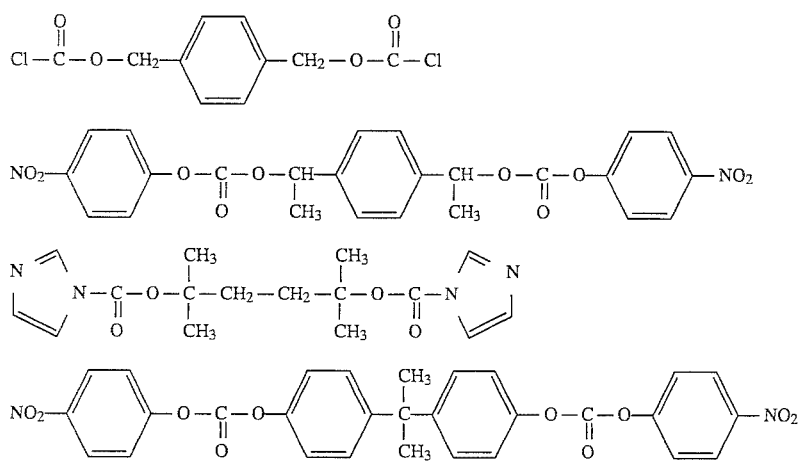

A number of hydroxyl-terminated siloxanes of the following structural formulae are also suitable:

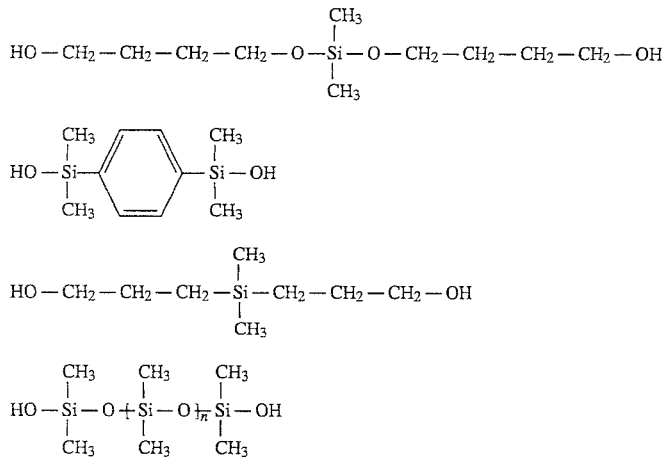

n=1–100

The polycondensation reactions can be carried out by known methods for the synthesis of polycarbonates using phosgene (cf. D. Braun, H. Cherdron and W. Kern, Praktikum der makromolekularen organischen Chemie, page 257), carbonylbisimidazole (cf. H. Staab, Angew. Chem. 74 (1962), 407) or active esters, such as 4-nitrophenyl carbonates (cf. J. Frechet, Makromol. Chem., Rapid Comm. 7 (1986), 121–126). The sulfonium salts containing hydroxyl functional groups are condensed in appropriate amounts with the corresponding diols or the active ester derivatives in a suitable solvent.

Another possible method of synthesizing the novel radiation-sensitive polymers is the preparation of a polycondensate which contains sulfur atoms in the main chain and is subsequently reacted with an iodonium salt in accordance with the following equation:

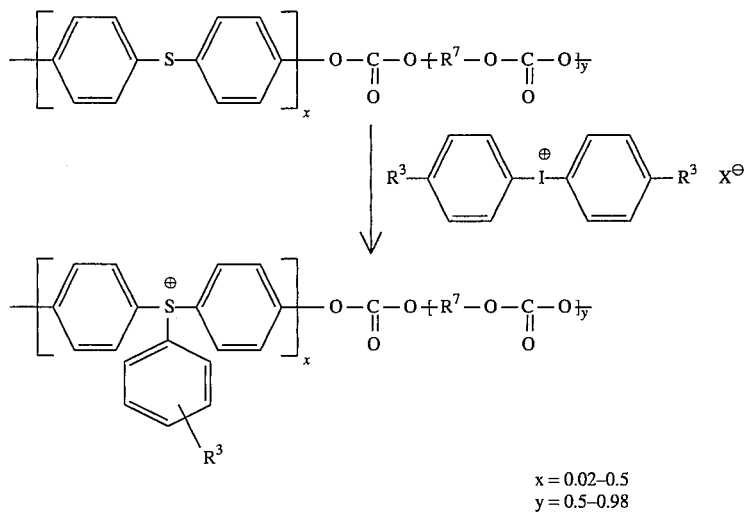

x = 0.02–0.5
y = 0.5–0.98

For the synthesis of sulfonium salts via iodonium salts, see J. Crivello, Advances in Polymer Science 62, Springer Verlag Heidelberg 1984, page 9, and the literature cited therein.

The molecular weights of the novel polymers are in general from 5,000 to 200,000, preferably from 10,000 to 80,000 (molecular weight determined by light scattering).

For further processing and use, the novel polymers are generally dissolved in a suitable solvent, eg. cyclohexanone, ethylene glycol ethyl ether acetate or methylpropyleneglycol acetate, applied as a thin film of about 1–2 μm to a substrate, for example a silicon wafer, heated under controlled conditions, for example at 60°–120° C., exposed imagewise and again heated under controlled conditions at 40°–120° C. The exposed areas can then be removed using an alkaline or polar solvent. If necessary, the exposed areas which have decomposed into the monomer building blocks can also be removed under reduced pressure, with or without the aid of a short wash process with a polar solvent, so that crisp structures are produced.

Suitable developers are alkaline solutions having a pH of greater than 11, for example aqueous solutions of alkali metal hydroxides, tetraalkylammonium hydroxides or amines, or polar solvents, for example isopropanol.

For example the novel polymers are suitable for exposure in the short-wave UV range below 300 nm to X-ray radiation and electron beams and, where suitable monomer building blocks are chosen, ie. those which absorb in the relatively long-wave UV range, or when sensitizers, such as phenothiazine or perylene, are added, also for exposure in the near UV range above 300 nm.

The novel radiation-sensitive polymers are suitable for the production of photoresists, in particular for the production of resists for microlithography, and as circuit board resists. They possess in particular high sensitivity, high resolution, good stability to etching and high resistance to plasmas, in particular oxygen plasmas, when siloxanes are used in the polymer chain, and may be capable of being developed by the dry method.

The production of semiconductor structural elements using the novel radiation-sensitive polymers is carried out in a conventional manner by the photolithography technique, as described in, for example, Peter Kästner, Halbleitertechnologie, Vogel-Verlag, Würzburg 1980, pages 75 to 117.

In the Examples which follow, parts and percentages are by weight unless stated otherwise.

EXAMPLE 1

Synthesis of the polymers via iodonium salts

A polycarbonate is prepared similarly to the method in D. Braun, H. Cherdron and W. Kern, Praktikum der makromolekularen organischen Chemie, Hüthig-Verlag, page 257, by using the analogous sulfur compound bis(hydroxyphenyl) sulfide instead of bisphenol A.

2.44 parts of this polycarbonate (polyoxycarbonyloxy-1, 4-phenylenethio-1,4-phenylene), 4.7 parts of diphenyliodonium hexafluoroarsenate and 0.2 part of copper-(II) acetate are combined in a flask and stirred for 3 hours at 120° C. The reaction mixture is introduced into a beaker and extracted three times with ether. 3.0 parts of a radiation-sensitive polymer which contains carbonate (IR: 1730 cm$^{-1}$) and sulfonium hexafluoroarsenate groups (IR: 700 cm$^{-1}$) are formed.

Elemental analysis: C:48.8 H:3.9 S:6.4 As:12.1 F:18.7 I:<0.5

Investigation of lithography 2.0 parts of this polymer are dissolved in 8.0 parts of cyclohexanone and the solution is filtered through a teflon filter having a pore diameter of 0.2 μm and is applied in a layer thickness of about 1.0 μm to silicon wafers by spin coating, the silicon wafers having been treated beforehand with hexamethyldisilazane as an adhesion promoter. The coated wafers are heated for 5 minutes at 90° C. on a hotplate. The wafers are then exposed imagewise to excimer laser light of wavelength 248 nm through a chromium-coated quartz mask in a Süss MA56 contact/proximity exposure unit by the contact method. Optimum exposure times are from 5 to 10 seconds. After exposure, the wafers are heated for 1 minute at 90° C. on a hotplate and then developed by immersing them for 1 minute in an aqueous alkaline solution, eg. Microposit® MF 319 (Shipley). Cleanly developed structures having a resolution of 1 μm are obtained.

EXAMPLE 2

The procedure described in Example 1 is followed, except that, instead of the polycarbonate of pure bis(hydroxyphenyl) sulfide, a polycarbonate of a 1:1 mixture of bisphenol A and bis-(hydroxyphenyl) sulfide is used. The exposure times are from 10 to 20 seconds, the procedure otherwise being as in Example 1, and cleanly developed 1 μm structures are likewise obtained.

EXAMPLE 3

The procedure described in Example 1 is followed, except that the polycarbonate from Example 2 is reacted with diphenyliodonium hexafluorophosphate instead of with the arsenate. The photosensitivity of this polymer is substantially lower, and exposure times of about 50 seconds are required.

EXAMPLE 4

Phenylbis-(4-hydroxyphenyl)-sulfonium hexafluoroarsenate is synthesized according to Example 2 in German Laid-Open Application DOS 3,721,740 and bis-(nitrophenyl) 1,1,4,4-tetramethyltetramethylenedicarbonate is synthesized by the method in Makromol. Chem., Rapid Comm. 7 (1986), 123, as starting compounds for the polycondensation reaction.

A radiation-sensitive polymer is obtained by condensation of 4.84 parts of phenylbis-(hydroxyphenyl)-sulfonium hexafluoroarsenate with 4.76 parts of bis-(4-nitrophenyl) 1,1,4,4-tetramethyltetramethylenedicarbonate in the presence of 12 parts of dry potassium carbonate, 1.2 parts of crown ether 18-crown-6 and 40 parts of dichloromethane, by refluxing for a reaction time of 72 hours. The yield of pure white polymer is 2.8 parts. The spectroscopic analysis is in agreement with the expected structure.

Molecular weight (light scattering): 57,500 g/mol

The lithographic investigations are carried out as in Example 1. Exposure times of from 0.5 to 1.5 seconds result and cleanly developed 1 μm structures are likewise obtained.

EXAMPLE 5

The procedure described in Example 4 is followed, except that bis-(4-nitrophenyl) 1,4-phenylenediethylidenedicarbonte is used instead of bis-(4-nitrophenyl) 1,1,4,4-tetramethyltetramethylenedicarbonate. The yield is 46%. The investigations are carried out as in Example 1. With an exposure time of 25 seconds, completely developed structures are obtained.

EXAMPLE 6

The procedure described in Example 5 is followed, except that phenylmethyl-2,5-dihydroxyphenylsulfonium hexafluorophosphate is used instead of phenylbis-(hydroxyphenyl)-sulfonium hexafluoroarsenate. The yield is 23%. The lithographic investigations are carried out as in Example 1, and cleanly developed structures are likewise obtained if exposure is effected for 10 seconds.

We claim:

1. A product prepared by imagewise exposing a radiation-sensitive polymer having a molecular weight determined by light scattering of between 5,000 and 200,000, which polymer contains both acid-labile groups and onium salt groups with non-nucleophilic counterions in the polymer main chain to electromagnetic radiation to produce exposed and unexposed portions of the polymer, and removing the exposed portions by contact with an alkaline developer or contact with a polar solvent or under reduced pressure, wherein the radiation-sensitive polymer contains in the main chain, as onium salt groups with non-nucleophilic counterions, units of formula (I)

where $R^1$ and $R^2$ are identical or different and are each alkylene of 1–9 carbons, phenylene, naphthylene or substituted phenylene of the formula

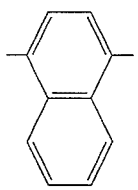

or phenylene substituted by methyl or methoxy, $R^3$ is alkyl of 1–9 carbons, phenyl, naphthyl or phenyl substituted by methyl, by butyl, or by methoxy, and X is halogen, $ClO_4$, $F-SO_3$, $CF_3-SO_3$, $BF_4$, $AsF_6$ or $SbF_6$.

* * * * *